US007824840B2

(12) United States Patent
Patel et al.

(10) Patent No.: US 7,824,840 B2
(45) Date of Patent: Nov. 2, 2010

(54) MULTI-LAYER IMAGEABLE ELEMENT WITH IMPROVED PROPERTIES

(75) Inventors: Jayanti Patel, Fort Collins, CO (US); Ting Tao, Fort Collins, CO (US); Shashikant Saraiya, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 369 days.

(21) Appl. No.: 11/836,840

(22) Filed: Aug. 10, 2007

(65) Prior Publication Data

US 2009/0042135 A1 Feb. 12, 2009

(51) Int. Cl.
*G03F 7/11* (2006.01)
*G03F 7/30* (2006.01)

(52) U.S. Cl. .................... 430/271.1; 430/944; 430/302; 430/276.1; 430/273.1; 101/467; 101/456; 101/457

(58) Field of Classification Search ....................... None
See application file for complete search history.

(56) References Cited

U.S. PATENT DOCUMENTS

| | | | | |
|---|---|---|---|---|
| 6,294,311 | B1 | 9/2001 | Shimazu et al. | |
| 6,352,811 | B1 | 3/2002 | Patel et al. | |
| 6,352,812 | B1 | 3/2002 | Shimazu et al. | |
| 6,358,669 | B1 | 3/2002 | Savariar-Hauck et al. | |
| 6,528,228 | B2 | 3/2003 | Hauck et al. | |
| 6,593,055 | B2 | 7/2003 | Shimazu et al. | |
| 7,049,045 | B2 | 5/2006 | Kitson et al. | |
| 7,144,661 | B1 | 12/2006 | Ray et al. | |
| 7,163,770 | B1 | 1/2007 | Saraiya et al. | |
| 7,186,482 | B2 | 3/2007 | Kitson et al. | |
| 7,223,506 | B1 | 5/2007 | Kitson et al. | |
| 7,247,418 | B2 | 7/2007 | Saraiya et al. | |
| 2004/0067432 | A1 | 4/2004 | Kitson et al. | |
| 2005/0244749 | A1* | 11/2005 | Kitson et al. | 430/270.1 |

FOREIGN PATENT DOCUMENTS

| | | |
|---|---|---|
| EP | 1276013 | 1/2003 |
| EP | 1627736 | 2/2006 |
| EP | 1788449 | 5/2007 |
| WO | 2007/064527 | 6/2007 |
| WO | 2008/048432 | 4/2008 |
| WO | 2008/063387 | 5/2008 |

OTHER PUBLICATIONS

"predominate-Defintion from the Merriam-Webster Online Dictionary", http://www.merriam-webster.com/dictionary/predominate, two pages retrieved Sep. 11, 2009 copyright 2009, 2 pages.*
"predominate-definition of predominate by the Free Online Dictionary, Thesarus and Encyclopedia", hhtp://www.thefreedictionary.com/predominant, 3 pages downloaded Sep. 11, 2009.*
U.S. Appl. No. 11/551,259, filed Oct. 20, 2006, titled Multi-Layer Imageable Element With Improved Properties by J. Patel et al.

* cited by examiner

*Primary Examiner*—Cynthia Hamilton
(74) *Attorney, Agent, or Firm*—J. Lanny Tucker

(57) ABSTRACT

Positive-working imageable elements comprise a radiation absorbing compound and inner and outer layers on a substrate having a hydrophilic surface. The inner layer comprises a specific polymeric binder represented by Structure (I):

$$-(A)_w-(B)_x-(C)_y-(D)_z- \quad (I)$$

wherein A represents recurring units derived from one or more N-alkoxymethyl (alkyl)acrylamides or alkoxymethyl (alkyl)acrylates, B represents recurring units derived from one or more ethylenically unsaturated polymerizable monomers having a pendant cyano group, C represents recurring units derived from one or more ethylenically unsaturated polymerizable monomers having one or more carboxy, sulfonic acid, or phosphate groups, D represents recurring units derived from one or more ethylenically unsaturated polymerizable monomers other than those represented by A, B, and C, w is from about 3 to about 80 weight %, x is from about 10 to about 85 weight %, y is from about 2 to about 80 weight %, and z is from about 10 to about 85 weight %. The use of this polymeric binder provides improved post-development bakeability chemical solvent resistance and desired digital speed.

16 Claims, No Drawings

MULTI-LAYER IMAGEABLE ELEMENT WITH IMPROVED PROPERTIES

FIELD OF THE INVENTION

This invention relates to positive-working, multi-layer imageable elements that have various improved properties in imaging and post-development bakeability and chemical resistance. It also relates to methods of using these elements to obtain lithographic printing plates and images therefrom.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Imaging of the imageable element with ultraviolet and/or visible radiation is typically carried out through a mask that has clear and opaque regions. Imaging takes place in the regions under the clear regions of the mask but does not occur in the regions under the opaque mask regions. If corrections are needed in the final image, a new mask must be made. This is a time-consuming process. In addition, dimensions of the mask may change slightly due to changes in temperature and humidity. Thus, the same mask, when used at different times or in different environments, may give different results and could cause registration problems.

Direct digital imaging has obviated the need for imaging through a mask and is becoming increasingly important in the printing industry. Imageable elements for the preparation of lithographic printing plates have been developed for use with infrared lasers. Thermally imageable, multi-layer elements are described, for example, in U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), and U.S. Pat. No. 6,528,228 (Savariar-Hauck et al.), and U.S. Patent Application Publication 2004/0067432 A1 (Kitson et al.).

U.S. Pat. No. 7,049,045 (Kitson et al.), U.S. Pat. No. 7,144,661 (Ray et al.), U.S. Pat. No. 7,186,482 (Kitson et al.), and U.S. Pat. No. 7,247,418 (Saraiya et al.) describe multi-layer, positive-working imageable elements having improved resistant to press chemicals and that can be baked to increase press run length.

In addition, U.S. Ser. No. 11/551,259 (filed Oct. 20, 2006 by Patel, Saraiya, and Tao) describes positive-working imageable elements that exhibit improved thermal post-development bakeability.

Problem to be Solved

Imaged multi-layer, positive-working elements are often baked after development to increase their on-press run length. While known imageable elements demonstrate excellent imaging and printing properties, there is a need to improve the post-development bakeability of imaged elements while increasing imaging sensitivity (speed) and maintaining resistance to press chemicals. In particular, it is desired to reduce the baking temperature and time while maintaining on-press run length. It is further desired to increase resistance to press chemicals without diminishing the other properties.

SUMMARY OF THE INVENTION

This invention provides a positive-working imageable element comprising a radiation absorbing compound and a substrate having a hydrophilic surface, and having on the substrate, in order:

an inner layer composition comprising a predominant polymeric binder, and an ink receptive outer layer, provided that upon thermal imaging, the exposed regions of the element are removable by an alkaline developer, wherein the predominant polymeric binder has an acid number of at least 40 and is represented by the following Structure (I):

$$(A)_w\text{-}(B)_n\text{—}(C)_y\text{-}(D)_z \qquad (I)$$

wherein

A represents recurring units derived from one or more N-alkoxymethyl (alkyl)acrylamides or alkoxymethyl (alkyl)acrylates, B represents recurring units derived from one or more ethylenically unsaturated polymerizable monomers having a pendant cyano group, C represents recurring units derived from one or more ethylenically unsaturated polymerizable monomers having one or more carboxy, sulfonic acid, or phosphate groups, D represents recurring units derived from one or more ethylenically unsaturated polymerizable monomers other than those represented by A, B, and C, w is from about 3 to about 80 weight %, x is from about 10 to about 85 weight %, y is from about 2 to about 80 weight %, and z is from about 10 to about 85 weight %.

In another aspect, this invention provides a method for forming an image comprising:

A) imagewise exposing the positive-working imageable element of this invention, thereby forming an imaged element with exposed and non-exposed regions, B) contacting the imaged element with an alkaline developer to remove only the exposed regions, and C) optionally baking the imaged and developed element in a manner as described below.

The multi-layer imageable elements of this invention have been found to exhibit improved post-development bakeability (or curability) while they also have fast digital speed and improved resistance to pressroom chemicals. In particular, good on-press run length is possible even if the imaged and developed element is baked (or cured) at lower than normal temperatures and times.

The method of the present invention is particularly useful for providing lithographic printing plates having a hydrophilic aluminum-containing substrate.

DETAILED DESCRIPTION OF THE INVENTION

Definitions

Unless the context indicates otherwise, when used herein, the terms "imageable element" and "printing plate precursor" are meant to be references to embodiments of the present invention.

In addition, unless the context indicates otherwise, the various components described herein such as the "predominant polymeric binder" and "secondary polymeric binder" used in the inner layer, "radiation absorbing compound", and similar terms also refer to mixtures of such components. Thus, the use of the article "a", "an", or "the" is not necessarily meant to refer to only a single component.

Unless otherwise indicated, percentages refer to percentages by dry weight.

"Acid number" (or acid value) is measured as mg KOH/g using known methods.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The multi-layer imageable elements can be used in a number of ways. The preferred use is as precursors to lithographic printing plates as described in more detail below. However, this is not meant to be the only use of the present invention. For example, the imageable elements can also be used in photomask lithography and imprint lithography, and to make chemically amplified resists, printed circuit boards, and microelectronic and microoptical devices.

Imageable Element

In general, the imageable elements of this invention comprise a substrate, an inner layer (also known as an "underlayer"), and an outer layer (also known as a "top layer") disposed over the inner layer. Before thermal imaging, the outer layer is not removable by an alkaline developer, but after thermal imaging, the imaged (exposed) regions of the outer layer are removable by the alkaline developer as described below. The inner layer is also removable by the alkaline developer. A radiation absorbing compound, generally an infrared radiation absorbing compound (defined below), is present in the imageable element. Typically, this compound is in the inner layer exclusively, but optionally it can also be in a separate layer between the inner and outer layers.

The imageable elements are formed by suitable application of an inner layer composition onto a suitable substrate. This substrate can be an untreated or uncoated support but it is usually treated or coated in various ways as described below prior to application of the inner layer composition. The substrate generally has a hydrophilic surface or at least a surface that is more hydrophilic than the outer layer composition. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet has been subjected to electrochemical graining and is anodized with sulfuric acid or phosphoric acid.

An interlayer may be formed by treatment of the aluminum support with, for example, a silicate, dextrine, calcium zirconium fluoride, hexafluorosilicic acid, an alkali phosphate solution containing an alkali halide (such as sodium fluoride), poly(vinyl phosphonic acid) (PVPA), vinyl phosphonic acid copolymer, poly(acrylic acid), or acrylic acid copolymer. Preferably, the grained and anodized aluminum support is treated with PVPA using known procedures to improve surface hydrophilicity.

The thickness of the substrate can be varied but should be sufficient to sustain the wear from printing and thin enough to wrap around a printing form. For example, many embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the various layer compositions applied thereon, and thus be an integral part of the printing press. The use of such imaged cylinders is described for example in U.S. Pat. No. 5,713,287 (Gelbart).

Inner Layer

The inner layer is disposed between the outer layer and the substrate and, typically, disposed directly on the substrate described above. The inner layer comprises a composition that includes one or more predominant polymeric binders that are defined in more detail below. Additional "secondary" polymeric binders (described below) are optional and may be useful. The use of the specific predominant polymeric binder provides the improved bakeability and chemical resistance of the resulting imageable elements of this invention.

The predominant polymeric binder has an acid number of at least 40, typically of at least 50, and up to 300, and more typically from about 50 to about 150. The desired acid number is provided by including various acidic groups along the polymeric backbone, usually as pendant groups as described below for the C recurring units.

The inner layer composition can also be defined as "curable" upon heating at from about 160 to about 220° C. for from about 2 to about 5 minutes, or by overall infrared radiation exposure at from about 800 to about 850 nm. By "curable", we mean that the inner layer composition comprising the predominant polymeric binder is curable upon heating it at from about 160 to about 220° C. for from about 2 to about 5 minutes, or from overall infrared radiation exposure at from about 800 to about 850 nm. Such a cured inner layer composition then is not damaged or removed when contacted with PS Plate Image Remover, PE-3S (Kodak Polychrome Graphics-Japan and distributed by Dainippon Ink & Chemicals, Inv.) at ambient temperatures for up to 10 minutes.

In addition, the predominant polymeric binder has a solubility of less than 30 mg/g when agitated (for example, stirred or shaken) for 24 hours at 25° C. in either an 80% aqueous solution of 2-butoxyethanol or an 80% aqueous solution of diacetone alcohol (or 4-hydroxy-4-methyl-2-pentanone).

The polymeric binder can be represented by the following Structure (I):

$$(A)_w\text{-}(B)_n\text{—}(C)_y\text{-}(D)_z \quad \text{(I)}$$

wherein A represents recurring units derived from one or more N-alkoxymethyl (alkyl)acrylamides or alkoxymethyl (alkyl)acrylates. Useful A recurring units can be derived from one or more ethylenically unsaturated monomers represented by the following Structure (II):

(II)

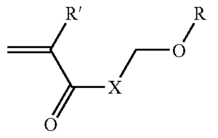

wherein R is a substituted or unsubstituted, branched or linear alkyl group having 1 to 8 carbon atoms (such as methyl, methoxymethyl, ethyl, iso-propyl, n-butyl, n-hexyl, benzyl, and n-octyl groups), a substituted or unsubstituted, branched or linear alkenyl group having 1 to 6 carbon atoms (such as allyl, vinyl, and 1,2-hexenyl groups), a substituted or unsubstituted cycloalkyl group having 5 or 6 carbon atoms in the carbocylic ring (such as cyclohexyl, p-methylcyclohexyl, and m-chlorocyclohexyl groups), or a substituted or unsubstituted phenyl group (such as phenyl, p-methoxyphenyl, p-ethylphenyl, and 2-chlorophenyl). For example, R can be a substituted or unsubstituted alkyl group having 1 to 4 carbon atoms, a substituted or unsubstituted cyclohexyl group, or a substituted or unsubstituted phenyl group.

R' is hydrogen or a substituted or unsubstituted, linear or branched alkyl group having 1 to 4 carbon atoms (such as methyl, methoxy, ethyl, iso-propyl, t-butyl, and n-butyl). Typically, R' is hydrogen or methyl.

X is —O— or —NH—.

For example, the A recurring units can be derived from one or more of N-methoxymethyl methacrylamide, N-iso-propoxymethyl methacrylamide, N-n-butoxymethyl methacrylamide, N-ethoxymethyl acrylamide, N-methoxymethyl acrylamide, iso-propoxymethyl methacrylate, N-cyclohexoxymethyl methacrylamide, and phenoxymethyl methacrylate.

The B represents recurring units are derived from one or more ethylenically unsaturated polymerizable monomers having a pendant cyano group. For example, they are derived from one or more (meth)acrylonitriles, cyanostyrenes, and cyanoacrylates.

The C recurring units are derived from one or more ethylenically unsaturated polymerizable monomers having one or more carboxy, sulfonic acid, or phosphate groups including but not limited to, (meth)acrylic acids, carboxystyrenes, N-carboxyphenyl (meth)acrylamides, and (meth)acryloylalkyl phosphates.

The D represents recurring units derived from one or more ethylenically unsaturated polymerizable monomers other than those represented by A, B, and C, and can be chosen from one or more ethylenically unsaturated polymerizable monomers represented by the following Structures (D1) through (D5):

(D1)

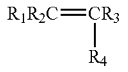

(D2)

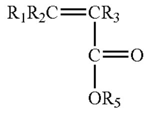

(D3)

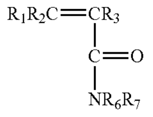

(D4)

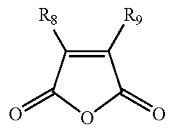

(D5)

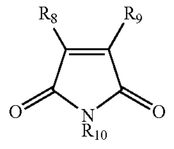

wherein $R_1$ and $R_2$ are independently hydrogen or substituted or unsubstituted, linear or branched alkyl, substituted or unsubstituted alkenyl, substituted or unsubstituted phenyl, halo, alkoxy, acyl, or acyloxy groups, or $R_1$ and $R_2$ together can form a substituted or unsubstituted cyclic ring with the carbon atom to which they are attached. The optional substituents on these groups would be readily apparent to one skilled in the art. Typically, $R_1$ and $R_2$ are independently hydrogen, or a substituted or unsubstituted alkyl group having 1 to 4 carbon atoms (such as methyl or ethyl groups).

$R_3$ and $R_4$ are independently hydrogen or substituted or unsubstituted alkyl, substituted or unsubstituted phenyl, or halo groups. Typically, $R_3$ and $R_4$ are independently substituted or unsubstituted alkyl groups having 1 to 6 carbon atoms, substituted or unsubstituted phenyl groups, and chloro groups.

$R_5$ is a substituted or unsubstituted alkyl, alkenyl, cycloalkyl, or phenyl group. Typically, $R_5$ is a methyl, ethyl, or benzyl group.

$R_6$ through $R_9$ are independently hydrogen or substituted or unsubstituted alkyl, alkenyl, alkoxy, or phenyl groups, halo, acyl, or acyloxy groups. Typically, $R_6$ through $R_9$ are independently hydrogen, methyl, or ethyl groups.

$R_{10}$ is hydrogen or a substituted or unsubstituted alkyl or phenyl group, or a hydroxy group. Typically, $R_{10}$ is a substituted or unsubstituted phenyl group.

The optional substituents for all of these groups defined above would be readily apparent to one skilled in the art.

Thus, classes of monomers from which the D recurring units can be derived include styrenes, (meth)acrylates, (meth) acrylamides, N-phenylmaleimides, iso-propyl(meth)acrylamides, and maleic anhydride. Other possibilities would be readily apparent to a worker skilled in the art.

In Structure (I), w is from about 3 to about 80 weight % (typically from about 10 to about 5 weight %), x is from about 10 to about 85 weight % (typically from about 20 to about 70 weight %), y is from about 2 to about 80 weight % (typically from about 5 to about 50 weight %), and z is from about 10 to about 85 weight % (typically from about 20 to about 70 weight %).

In some embodiments, the predominant polymeric binder comprises recurring units derived from:

one or more of N-methoxymethyl methacrylamide, N-iso-propoxymethyl methacrylamide, N-n-butoxymethyl methacrylamide, N-ethoxymethyl acrylamide, N-methoxymethyl acrylamide, iso-propoxymethyl methacrylate, N-cyclohexoxymethyl methacrylamide, and phenoxymethyl methacrylate, one or more of acrylonitrile, methacrylonitrile, (meth) acrylic acid, p-cyanostyrene, and ethyl-2-cyanoacrylate, one or more of acrylic acid, methacrylic acid, p-carboxystyrene, p-carboxyphenyl methacrylamide, and (meth)acryloylethyl phosphate, and one or more of styrene, N-phenylmaleimide, methacrylamide, and methyl methacrylate.

The amount of predominant polymeric binders generally present in the inner layer composition is a coverage of from about 40 to about 98 weight %, and typically at from about 60 to about 95 weight %, based on total dry inner layer composition weight. The predominant polymeric binder generally comprises at least 40 weight % and typically from about 60 to 100 weight % of the total polymeric binders in the inner layer.

In other embodiments, the predominant polymeric binder comprises:

in an amount of from about 10 to about 55 weight %, recurring units that are derived from one or more ethylenically unsaturated monomers represented by the following Structure (II):

(II)

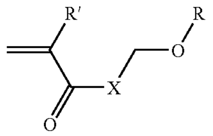

wherein R is an alkyl group having 1 to 8 carbon atoms, an alkenyl group having 1 to 6 carbon atoms, or a phenyl group, R' is hydrogen or an alkyl having 1 to 4 carbon atoms, and X is —O— or —NH—, in an amount of from about 20 to about 70 weight %, recurring units are derived from one or more (meth)acrylonitriles, cyanostyrenes, and cyanoacrylates, in an amount of from about 5 to about 50 weight %, recurring units are derived from one or more (meth)acrylic acids, carboxystyrenes, carboxyphenyl (meth)acrylamides, and (meth)acryloylalkyl phosphates, and in an amount of from about 20 to about 70 weight %, recurring units are derived from one or more ethylenically unsaturated polymerizable monomers represented by the following Structures (D1) through (D5):

(D1)

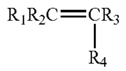

(D2)

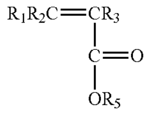

(D3)

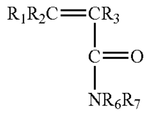

(D4)

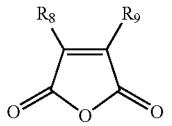

(D5)

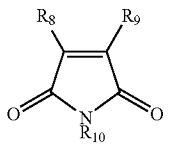

wherein $R_1$ and $R_2$ are independently hydrogen or alkyl, alkenyl, phenyl, halo, alkoxy, acyl, or acyloxy groups, or $R_1$ and $R_2$ together can form a cyclic ring with the carbon atom to which they are attached, $R_3$ and $R_4$ are independently hydrogen or alkyl, phenyl, or halo groups, $R_5$ is an alkyl, alkenyl, cycloalkyl, or phenyl group, $R_6$ through $R_9$ are independently hydrogen or alkyl, alkenyl, phenyl, halo, alkoxy, acyl, or acyloxy groups, and R10 is hydrogen or an alkyl, phenyl, or hydroxy group, wherein the predominant polymeric binder is present in an amount of from about 60 to about 95 weight %, the radiation absorbing compound is an infrared absorbing compound that is present in the inner layer composition only in an amount of from about 5 to about 25 weight % based on the total dry weight of the inner layer, and the predominant polymeric binder comprises from about 60 to 100 weight % of all polymeric binders in the inner layer composition.

Besides the predominant polymeric binder described above, the inner layer composition may also include one or more secondary polymeric binders, which materials are generally known in the art for use in the inner layer of multi-layer imageable elements. For example, useful secondary polymeric binders include the polymeric binders described for use in the inner layers of the imageable elements described in U.S. Pat. Nos. 6,294,311, 6,352,812, 6,593,055, 6,352,811, 6,358,669, 6,528,228, 7,049,045, 7,186,482, 7,144,661, and 7,247,418, and U.S. Patent Application Publication 2004/0067432, all noted above and incorporated herein by reference with respect to those polymeric binders. The amount of such secondary polymeric binders in the inner layer composition is no more than 60 weight %, and typically no more than 40 weight % of the total polymeric binders in the inner layer.

The inner layer composition generally exclusively comprises a radiation absorbing compound (for example, an infrared radiation absorbing compound) that absorbs radiation at from about 600 to about 1400 nm and typically at from about 700 to about 1200 nm, with minimal absorption at from about 300 to about 600 nm. This compound (sometimes known as a "photothermal conversion material" or "thermal convertor") absorbs radiation and converts it to heat. This compound may be either a dye or pigment. Examples of useful pigments are ProJet 900, ProJet 860 and ProJet 830 (all available from the Zeneca Corporation). Although a radiation absorbing compound is not necessary for imaging with a hot body, the imageable elements containing a radiation absorbing compounds may also be imaged with a hot body, such as a thermal head or an array of thermal heads.

Useful IR absorbing compounds also include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as 0CAB-O-JET® 200 or CAB-O-JET® 300 (manufactured by the Cabot Corporation) are also useful.

IR dyes (especially those that are soluble in an alkaline developer) are useful to prevent sludging of the developer by insoluble material. Examples of suitable IR dyes include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indoaniline dyes, merostyryl dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in numerous publications including U.S. Pat. No. 6,294,311 (Shimazu et al.), U.S. Pat. No. 6,309,792 (Hauck et al), U.S. Pat. No. 6,569,603 (Furukawa), U.S. Pat. No. 6,264,920 (Achilefu et al.), U.S. Pat. No. 6,153,356 (Urano et al.), U.S. Pat. No. 6,787,281 (Tao et al.), and U.S. Pat. No. 5,208,135 (Patel et al.), and EP 1,182,033A1 (Fujimaki et al.), and the references cited thereon.

Examples of useful IR absorbing compounds include ADS-830A and ADS-1064 (American Dye Source, Baie D'Urfe, Quebec, Canada), EC2117 (FEW, Wolfen, Germany), Cyasorb® IR 99 and Cyasorb® IR 165 (GPTGlendale Inc. Lakeland, Fla.), and IR Absorbing Dye A used in the Examples below.

Near infrared absorbing cyanine dyes are also useful and are described for example in U.S. Pat. No. 6,309,792 (noted above), U.S. Pat. No. 6,264,920 (noted above), U.S. Pat. No. 6,153,356 (noted above), U.S. Pat. No. 6,787,281 (noted above), and U.S. Pat. No. 5,496,903 (Watanate et al.). Suitable dyes may be formed using conventional methods and starting materials or obtained from various commercial sources including American Dye Source (Canada) and FEW Chemicals (Germany). Other useful dyes for near infrared diode laser beams are described, for example, in U.S. Pat. No. 4,973,572 (DeBoer).

In addition to low molecular weight IR-absorbing dyes, IR dye moieties bonded to polymers can be used as well. Moreover, IR dye cations can be used, that is, the cation is the IR absorbing portion of the dye salt that ionically interacts with a polymer comprising carboxy, sulfo, phosphor, or phosphono groups in the side chains.

The radiation absorbing compound can be present in an amount of generally from about 2% to about 50% and typically from about 5 to about 25%, based on the total inner layer dry weight. The particular amount needed for a given IR absorbing compound can be readily determined by one skilled in the art.

The inner layer can include other components such as surfactants, dispersing aids, humectants, biocides, viscosity builders, drying agents, defoamers, preservatives, antioxidants, colorants, and other polymers such as novolaks, resoles, or resins that have activated methylol and/or activated alkylated methylol groups as described for example in U.S. Pat. No. 7,049,045 (noted above).

The inner layer generally has a dry coating coverage of from about 0.5 to about 3.5 $g/m^2$ and typically from about 1 to about 2.5 $g/m^2$.

Outer Layer

The outer layer is disposed over the inner layer and in most embodiments there are no intermediate layers between the inner and outer layers. The outer layer becomes soluble or dispersible in the developer upon thermal exposure. It typically comprises one or more ink-receptive polymeric materials, known as polymer binders, and a dissolution inhibitor or colorant. Alternatively, or additionally, a polymer binder comprises polar groups and acts as both the binder and dissolution inhibitor.

Any polymeric binders may be employed in the outer layer of the imageable elements if they have been previously used in outer layers of prior art multi-layer thermally imageable elements. For example, the outer layer polymeric binders can be one or more of those described in U.S. Pat. No. 6,358,669 (Savariar-Hauck), U.S. Pat. No. 6,555,291 (Hauck), U.S. Pat. No. 6,352,812 (Shimazu et al.), U.S. Pat. No. 6,352,811 (Patel et al.), U.S. Pat. No. 6,294,311 (Shimazu et al.), U.S. Pat. No. 6,893,783 (Kitson et al.), and U.S. Pat. No. 6,645,689 (Jarek), U.S. Patent Application Publications 2003/0108817 (Patel et al) and 2003/0162126 (Kitson et al.), and WO 2005/018934 (Kitson et al.).

Generally, the polymer binder in the outer layer is a light-insensitive, water-insoluble, aqueous alkaline developer-soluble, film-forming phenolic resin that has a multiplicity of phenolic hydroxyl groups. Phenolic resins have a multiplicity of phenolic hydroxyl groups, either on the polymer backbone or on pendent groups. Novolak resins, resol resins, acrylic resins that contain pendent phenol groups, and polyvinyl phenol resins are useful phenolic resins.

Novolak resins are commercially available and are well known to those in the art. Novolak resins are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolak resins include, for example, phenol-formaldehyde resins, cresol-formaldehyde resins, phenol-cresol-formaldehyde resins, p-t-butylphenol-formaldehyde resins, and pyrogallol-acetone resins. Useful novolak resins are prepared by reacting m-cresol, mixtures of m-cresol and p-cresol, or phenol with formaldehyde using conditions well known to those skilled in the art.

A solvent soluble novolak resin is one that is sufficiently soluble in a coating solvent to produce a coating solution that can be coated to produce an outer layer. In some cases, it may be desirable to use a novolak resin with the highest weight-average molecular weight that maintains its solubility in common coating solvents, such as acetone, tetrahydrofuran, and 1-methoxypropan-2-ol. Outer layers comprising novolak resins, including for example m-cresol only novolak resins (i.e. those that contain at least about 97 mol-% m-cresol) and m-cresol/p-cresol novolak resins that have up to 10 mol-% of p-cresol, having a weight average molecular weight of at least 10,000 and typically at least 25,000, are useful. Outer layers comprising m-cresol/p-cresol novolak resins with at least 10 mol-% of p-cresol, having a weight average molecular weight of about 8,000 up to about 25,000, may also be used. In some instances, novolak resins prepared by solvent condensation may be desirable. Outer layers comprising these resins are disclosed for example in U.S. Pat. No. 6,858,359 (Kitson, et al.).

Other useful phenolic resins are poly(vinyl phenol) resins that include polymers of one or more hydroxyphenyl containing monomers such as hydroxystyrenes and hydroxyphenyl (meth)acrylates. Other monomers not containing hydroxy groups can be copolymerized with the hydroxy-containing monomers. These resins can be prepared by polymerizing one or more of the monomers in the presence of a radical initiator or a cationic polymerization initiator using known reaction conditions. The weight average molecular weight ($M_w$) of these polymers is from about 1000 to about 200,000, and typically from about 1,500 to about 50,000 g/mol.

Examples of useful hydroxy-containing polymers include ALNOVOL SPN452, SPN400, HPN10O (Clariant GmbH), DURITE PD443, SD423A, SD126A (Borden Chemical, Inc.), BAKELITE 6866LB02, AG, 6866LB03 (Bakelite AG), KR 400/8 (Koyo Chemicals Inc.), HRJ 1085 and 2606 (Schenectady International, Inc.), and Lyncur CMM (Siber Hegner), all of which are described in U.S. Patent Application Publication 2005/0037280 (noted above). A useful polymer is PD-140 described for the Examples below.

The outer layer can also include non-phenolic polymeric materials as film-forming binder materials in addition to or instead of the phenolic resins described above. Such non-phenolic polymeric materials include polymers formed from maleic anhydride and one or more styrenic monomers (that is styrene and styrene derivatives having various substituents on the benzene ring), polymers formed from methyl methacrylate and one or more carboxy-containing monomers, and mixtures thereof. These polymers can comprise recurring units derived from the noted monomers as well as recurring units derived from additional, but optional monomers [such as (meth)acrylates, (meth)acrylonitrile and (meth)acrylamides]. Other hydroxy-containing polymeric binders also include heat-labile moieties as described for example in U.S. Pat. No. 7,163,777 (Ray et al.).

The polymers derived from maleic anhydride generally comprise from about 1 to about 50 mol % of recurring units derived from maleic anhydride and the remainder of the recurring units derived from the styrenic monomers and optionally additional polymerizable monomers.

The polymer formed from methyl methacrylate and carboxy-containing monomers generally comprise from about 80 to about 98 mol % of recurring units derived from methyl methacrylate. The carboxy-containing recurring units can be derived, for example, from acrylic acid, methacrylic acid, itaconic acid, maleic acid, and similar monomers known in the art. Carboxy-containing polymers are described for example in U.S. Pat. No. 7,169,518 (Savariar-Hauck et al.).

The outer layer can also comprise one or more polymer binders having pendant epoxy groups sufficient to provide an epoxy equivalent weight of from about 130 to about 1000 (preferably from about 140 to about 750) as described for example in U.S. Pat. No. 7,160,653 (Huang et al.). Any film-forming polymer containing the requisite pendant epoxy groups can be used including condensation polymers, acrylic resins, and urethane resins. The pendant epoxy groups can be part of the polymerizable monomers or reactive components used to make the polymers, or they can be added after polymerization using known procedures. The outer layer can comprise one or more acrylic resins that are derived from one or more ethylenically unsaturated polymerizable monomers, at least one of which monomers comprises pendant epoxy groups.

Useful polymers of this type have pendant epoxy groups attached to the polymer backbone through a carboxylic acid ester group such as a substituted or unsubstituted —C(O)O-alkylene, —C(O)O-alkylene-phenylene-, or —C(O)O-phenylene group wherein alkylene has 1 to 4 carbon atoms. Ethylenically unsaturated polymerizable monomers having pendant epoxy groups useful to make these polymer binders include glycidyl acrylate, glycidyl methacrylate, 3,4-epoxycyclohexyl methacrylate, and 3,4-epoxycyclohexyl acrylate.

The epoxy-containing polymers can also comprise recurring units derived from one or more ethylenically unsaturated polymerizable monomers that do not have pendant epoxy groups including but not limited to, (meth)acrylates, (meth) acrylamides, vinyl ether, vinyl esters, vinyl ketones, olefins, unsaturated imides (such as maleimide), N-vinyl pyrrolidones, N-vinyl carbazole, vinyl pyridines, (meth)acrylonitriles, and styrenic monomers. For example, a styrenic monomer could be used in combination with methacrylamide, acrylonitrile, maleimide, vinyl acetate, or N-vinyl pyrrolidone.

Still other useful polymeric binders for the outer layer include those having a polymer backbone and pendant sulfonamide groups such as pendant —X—C(=T)-NR—S(=O)$_2$— groups that are attached to the polymer backbone, wherein X is oxy or amido, T is oxygen or sulfur, and R is hydrogen, halo, or an alkyl group having 1 to 6 carbon atoms, as described in U.S. Pat. No. 7,163,770 (Saraiya et al.).

The polymeric binders in the outer layer can also be branched hydroxystyrene polymers that include recurring units derived from 4-hydroxystyrene, which recurring units are further substituted with repeating 4-hydroxystyrene units positioned ortho to the hydroxy groups.

The one or more polymer binders are present in the outer layer in an amount of at least 60 weight %, and typically from about 65 to about 99.5 weight %.

The outer layer generally and optionally comprises a dissolution inhibitor that functions as a solubility-suppressing component for the binder. Dissolution inhibitors generally have polar functional groups that are thought to act as acceptor sites for hydrogen bonding, such as with hydroxyl groups of the binder. Dissolution inhibitors that are soluble in the developer are most suitable. Alternatively, or additionally, the polymer binder may contain solubility-suppressing polar groups that function as the dissolution inhibitor. Useful dissolution inhibitor compounds are described for example in U.S. Pat. No. 5,705,308 (West, et al.), U.S. Pat. No. 6,060,222 (West, et al.), and U.S. Pat. No. 6,130,026 (Bennett, et al.).

Compounds that contain a positively charged (that is, quaternized) nitrogen atom useful as dissolution inhibitors include, for example, tetraalkyl ammonium compounds, quinolinium compounds, benzothiazolium compounds, pyridinium compounds, and imidazolium compounds. Representative tetraalkyl ammonium dissolution inhibitor compounds include tetrapropyl ammonium bromide, tetraethyl ammonium bromide, tetrapropyl ammonium chloride, and trimethylalkyl ammonium chlorides and trimethylalkyl ammonium bromides, such as trimethyloctyl ammonium bromide and trimethyldecyl ammonium chloride. Representative quinolinium dissolution inhibitor compounds include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene)-2-methyl-1-(propenyl)benzothiazolium cationic dyes and 3-ethyl-2-methyl benzothiazolium iodide.

Diazonium salts are useful as dissolution inhibitor compounds and include, for example, substituted and unsubstituted diphenylamine diazonium salts, such as methoxy-substituted diphenylamine diazonium hexafluoroborates. Representative sulfonic acid esters useful as dissolution inhibitor compounds include ethyl benzene sulfonate, n-hexyl benzene sulfonate, ethyl p-toluene sulfonate, t-butyl p-toluene sulfonate, and phenyl p-toluene sulfonate. Representative phosphate esters include trimethyl phosphate, triethyl phosphate, and tricresyl phosphate. Useful sulfones include those with aromatic groups, such as diphenyl sulfone. Useful amines include those with aromatic groups, such as diphenylamine and triphenylamine.

Keto-containing compounds useful as dissolution inhibitor compounds include, for example, aldehydes, ketones, especially aromatic ketones, and carboxylic acid esters. Representative aromatic ketones include xanthone, flavanones, flavones, 2,3-diphenyl-1-indenone, 1'-(2'-acetonaphthonyl) benzoate, 2,6-diphenyl-4H-pyran-4-one and 2,6-diphenyl-4H-thiopyran-4-one. Representative carboxylic acid esters include ethyl benzoate, n-heptyl benzoate, and phenyl benzoate.

Other readily available dissolution inhibitors are triarylmethane dyes, such as ethyl violet, crystal violet, malachite green, brilliant green, Victoria blue B, Victoria blue R, Victoria blue BO, BASONYL Violet 610. These compounds can also act as contrast dyes that distinguish the non-exposed regions from the exposed regions in the developed imageable element.

When a dissolution inhibitor compound is present in the outer layer, it typically comprises at least about 0.1 weight %, more generally from about 0.5 to about 30 weight %, or from about 1 to about 15 weight %, based on the dry weight of the outer layer.

Alternatively, or additionally, the polymer binder in the outer layer can comprise polar groups that act as acceptor sites for hydrogen bonding with the hydroxy groups present in the polymeric material and, thus, act as both the binder and dissolution inhibitor. These derivatized polymeric materials can be used alone in the outer layer, or they can be combined with other polymeric materials and/or solubility-suppressing components. The level of derivatization should be high enough that the polymeric material acts as a dissolution inhibitor, but not so high that, following thermal imaging, the polymeric material is not soluble in the developer. Although the degree of derivatization required will depend on the nature of the polymeric material and the nature of the moiety containing the polar groups introduced into the polymeric material, typically from about 0.5 mol % to about 5 mol % of the hydroxyl groups will be derivatized.

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolak resin in which from about 1 to about 3 mol % of the hydroxyl groups has been converted to phenyl sulfonate or p-toluene sulfonate (tosyl) groups.

Another group of polymeric materials that comprise polar groups and function as dissolution inhibitors are derivatized phenolic resins that contain the diazonaphthoquinone moiety. Polymeric diazonaphthoquinone compounds include derivatized resins formed by the reaction of a reactive derivative that contains diazonaphthoquinone moiety and a polymeric material that contains a suitable reactive group, such as a hydroxyl or amino group. Derivatization of phenolic resins with compounds that contain the diazonaphthoquinone moiety is known in the art and is described, for example, in U.S. Pat. Nos. 5,705,308 and 5,705,322 (both West, et al.). An example of a resin derivatized with a compound that comprises a diazonaphthoquinone moiety is P-3000 (available from PCAS, France) that is a naphthoquinone diazide of a pyrogallol/acetone resin.

To reduce ablation during imaging with infrared radiation, the outer layer is generally substantially free of radiation absorbing compounds, meaning that none of those compounds are purposely incorporated therein and insubstantial amounts diffuse into it from other layers. Thus, any radiation absorbing compounds in the outer layer absorb less than about 10% of the imaging radiation, typically less than about 3% of the imaging radiation, and the amount of imaging radiation absorbed by the outer layer, if any, is not enough to cause ablation of the outer layer.

The outer layer can also include other components such as coating surfactants, dispersing aids, humectants, biocides, viscosity builders, drying agents, antifoaming agents, preservatives, antioxidants, colorants, and contrast dyes.

The outer layer generally has a dry coating coverage of from about 0.2 to about 2 $g/m^2$ and typically from about 0.4 to about 1 $g/m^2$.

There may be a separate layer that is disposed between the inner and outer layers. This separate layer (or interlayer) can act as a barrier to minimize migration of radiation absorbing compounds from the inner layer to the outer layer. This interlayer generally comprises a polymeric material that is soluble in an alkaline developer. A useful polymeric material of this type is a poly(vinyl alcohol). Generally, the interlayer should be less than one-fifth as thick as the inner layer.

Preparation of the Imageable Element

The imageable element can be prepared by sequentially applying an inner layer composition (or formulation) over the surface of the substrate (and any other hydrophilic layers provided thereon), and then applying an outer layer formulation over the inner layer using conventional coating or lamination methods. It is important to avoid intermixing the inner and outer layer formulations.

The inner and outer layer formulations can be applied by dispersing or dissolving the desired ingredients in suitable coating solvents, and the resulting formulations are sequentially or simultaneously applied to the substrate using any suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the inner and outer layers depends upon the nature of the polymeric materials and other components in the formulations. To prevent the inner and outer layer formulations from mixing or the inner layer dissolving when the outer layer formulation is applied, the outer layer should be coated from a solvent in which the polymeric material(s) of the inner layer are insoluble. Generally, the inner layer formulation is coated out of a solvent mixture of methyl ethyl ketone (MEK), 1-methoxypropan-2-ol (PGME), γ-butyrolactone (BLO), and water, a mixture of diethyl ketone (DEK), water, methyl lactate, and γ-butyrolactone BLO), or a mixture of methyl lactate, methanol, and dioxolane. The outer layer formulation is generally coated out of DEK, a mixture of DEK and 1-methoxy-2-propyl acetate, a mixture of 1,3-dioxolane, 1-methoxypropan-2-ol (PGME), γ-butyrolactone (BLO), and water, a mixture of MEK and PGME, or a mixture of DEK and acetone.

Alternatively, the inner and outer layers may be applied by conventional extrusion coating methods from melt mixtures of the respective layer compositions. Typically such melt mixtures contain no volatile organic solvents.

Intermediate drying steps may be used between applications of the various layer formulations to remove solvent(s) before coating other formulations. Drying steps may also help in preventing the mixing of the various layers.

Representative methods for preparing imageable elements of this invention are shown in the Examples below.

The imageable elements have any useful form including, but not limited to, printing plate precursors (web or plates), printing cylinders, printing sleeves and printing tapes (including flexible printing webs). For example, the imageable members are printing plate precursors to provide lithographic printing plates.

Printing plate precursors can be of any useful size and shape (for example, square or rectangular) having the requisite inner and outer layers disposed on a suitable substrate. Printing cylinders and sleeves are known as rotary printing members having the substrate and inner and outer layers in a cylindrical form. Hollow or solid metal cores can be used as substrates for printing sleeves.

Imaging and Development

During use, the imageable element is exposed to a suitable source of imaging radiation (such as infrared radiation) using a laser at a wavelength of from about 600 to about 1500 nm and typically from about 600 to about 1200 nm. The lasers used to expose the imaging member of this invention are preferably diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus is available as models of Creo Trendsetter® imagesetters available from Creo Corporation (a subsidiary of Eastman Kodak Company, Burnaby, British Columbia, Canada) that contain laser diodes that emit near infrared radiation at a wavelength of about 830 nm. Other suitable imaging sources include the Gerber Crescent 42T Platesetter that operates at a wavelength of 1064 nm (available from Gerber Scientific, Chicago, Ill.) and the Screen PlateRite 4300 series or 8600 series platesetters (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging energies may be in the range of from about 50 to about 1500 mJ/cm$^2$, and typically from about 75 to about 400 mJ/cm$^2$. More typically, the imaging energy is less than 140 mJ/cm$^2$ or less than 120 mJ/cm$^2$.

While laser imaging is usual in the practice of this invention, imaging can be provided by any other means that provides thermal energy in an imagewise fashion. For example, imaging can be accomplished using a thermoresistive head (thermal printing head) in what is known as "thermal printing" as described for example in U.S. Pat. No. 5,488,025 (Martin et al.) and as used in thermal fax machines and sublimation printers. Thermal print heads are commercially available (for example, as Fujitsu Thermal Head FTP-040 MCS001 and TDK Thermal Head F415 HH7-1 089).

In any case, direct digital imaging is generally used for imaging. The image signals are stored as a bitmap data file on a computer. The bitmap data files are constructed to define the hue of the color as well as screen frequencies and angles.

Imaging of the imageable element produces an imaged element that comprises a latent image of imaged (exposed) and non-imaged (non-exposed) regions. Developing the imaged element with a suitable alkaline developer removes the exposed regions of the outer layer and the layers (including the inner layer) underneath them, and exposing the hydrophilic surface of the substrate. Thus, the imageable element is "positive-working". The exposed (or imaged) regions of the hydrophilic surface repel ink while the unexposed (or non-imaged) regions of the outer layer accept ink.

More particularly, development is carried out for a time sufficient to remove the imaged (exposed) regions of the outer layer and underlying layers, but not long enough to remove the non-imaged (non-exposed) regions of the outer layer. Thus, the imaged (exposed) regions of the outer layer are described as being "soluble" or "removable" in the alkaline developer because they are removed, dissolved, or dispersed within the alkaline developer more readily than the non-imaged (non-exposed) regions of the outer layer. Thus, the term "soluble" also means "dispersible" or "removable".

The imaged elements are generally developed using conventional processing conditions. Both aqueous alkaline developers and organic solvent-containing developers can be used.

Organic solvent-containing alkaline developers are generally single-phase solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight.

Particularly useful alkaline developers are organic solvent-containing developers having a pH less than 12 or typically from about 7 to about 12. Representative solvent-containing alkaline developers include ND-1 Developer, 955 Developer, and 956 Developer (available from Eastman Kodak Company).

Aqueous alkaline developers generally have a pH of at least 7 and preferably of at least 11. Useful alkaline aqueous developers include 3000 Developer, 9000 Developer, GoldStar™ Developer, GreenStar Developer, ThermalPro Developer, Protherm® Developer, MX1813 Developer, and MX1710 Developer (all available from Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

It is also possible that the alkaline developer contains one or more thiosulfate salts or amino compounds that include an alkyl group that is substituted with a hydrophilic group such as a hydroxy group, polyethylene oxide chain, or an acidic group having a pKa less than 7 (more preferably less than 5) or their corresponding salts (such as carboxy, sulfo, sulfonate, sulfate, phosphonic acid, and phosphate groups). Particularly useful amino compounds of this type include, but are not limited to, monoethanolamine, diethanolamine, glycine, alanine, aminoethylsulfonic acid and its salts, aminopropylsulfonic acid and its salts, and Jeffamine compounds (for example, an amino-terminated polyethylene oxide). The solvent-containing developers can have an alkaline, neutral, or slightly acidic pH.

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced that has excellent resistance to press room chemicals, for example as shown by the various solvent tests in the Examples below.

Following development, the imaged element can be rinsed with water and dried in a suitable fashion. The dried element can also be treated with a conventional gumming solution (preferably gum arabic).

Post-Development Baking

The imaged and developed element can be baked (or cured) in a postbake operation that can be carried out to increase run length of the resulting imaged element. Baking can be carried out in a suitable oven, for example at a temperature of less than 300° C. and typically at less than 250° C. for from about 2 to about 10 minutes. For example, the baking is done very quickly at a temperature of from about 160 to about 220° C. for from about 2 to about 5 minutes.

Alternatively, the imaged and developed element (for example, printing plate) can be "baked" or cured by overall exposure to IR radiation at a wavelength of from about 800 to about 850 nm. This exposure creates conditions that enable very controllable baking effects with minimal distortion. For example, the imaged and developed element (for example, lithographic printing plate) can be passed through a commercial QuickBake 1250 oven (available from Eastman Kodak Company) at 4 feet (1.3 m) per minute at the 45% power setting of an infrared lamp to achieve a similar baking result from heating the element in an oven at 200° C. for 2 minutes.

Printing

Printing can be carried out by applying a lithographic ink and fountain solution to the printing surface of the imaged element. The ink is taken up by the non-imaged (non-exposed or non-removed) regions of the outer layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

MATERIALS AND METHODS USED IN THE EXAMPLES:

The materials described below were used in the examples. Unless otherwise indicated, the chemical components can be obtained from a number of commercial sources including Aldrich Chemical Company (Milwaukee, Wis.).

AIBN is azobisisobutyolnitrile [free radical initiator, Vazo-64 that was obtained from DuPont (Wilmington, Del.].

BLO represents γ-butyrolactone.

Byk® 307 is a polyethoxylated dimethyl polysiloxane copolymer that was obtained from Byk® Chemie (Wallingford, Conn.) in a 10 wt. % PGME solution.

D11 dye is ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1) as supplied by PCAS (Longjumeau, France).

DAA represents diacetone alcohol.

DEK represents diethyl ketone.

Developer is an organic solvent based (phenoxyethanol) alkaline negative developer that is available from Eastman Kodak Company (Norwalk, Conn.).

DMAC represents N,N-dimethyl acetamide.

Ethyl violet is C.I. 42600 (CAS 2390-59-2, $\lambda_{max}$=596 nm) having a formula of $(p\text{-}(CH_3CH_2)_2NC_6H_4)_3C^+C^-$.

IR Dye A is represented by the following formula:

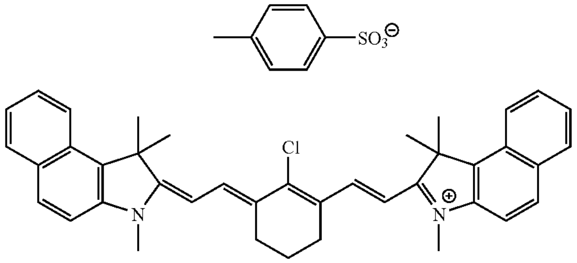

IR Dye A

MEK represents methyl ethyl ketone.

P3000 represents the reaction product of 1,2-naphthaquinone-5-sulfonyl chloride with pyrogallol/acetone condensate (PCAS, Longjumeau, France).

PD-140 is a cresol/formaldehyde novolac resin (75:25 m-cresol/-p-cresol) (Borden Chemical, Louisville, Ky.).

PGME represents 1-methoxypropan-2-ol (or Dowanol PM).

RX-04 represents a copolymer derived from styrene and maleic anhydride that was obtained from Gifu (Japan).

SYNTHESIS EXAMPLE S1

Polymer A-Inventive

AIBN (0.4 g), PMI (4.0 g), acrylonitrile (9.0 g), methacrylic acid (2.0 g), N-methoxy methyl methacrylamide (3.0 g), methacrylamide (2.0 g), and DMAC (80 g) were placed in a 500-ml 3-necked flask, equipped with magnetic stirring, temperature controller, condenser, and $N_2$ inlet. The reaction mixture was heated to 60° C. and stirred under $N_2$ protection for 16 hours after which AIBN (0.1 g) was added and the reaction was continued for another 6 hours. The reaction mixture was slowly dropped into 3000 ml of ice water while stirring and a precipitate was formed. After filtration and drying at below 50° C., 16.2 g of the desired solid polymer were obtained.

Polymer A was evaluated for its solubility (solvent resistance) by mixing 0.502 g of Polymer A with 20.0 g of 80% 2-butoxyethanol (in water) and stirring overnight (~16 h) at 25° C. The resulting mixture was filtered and washed with 20 ml of water three times. The recovered Polymer A was dried at 45° C. for 24 hours, providing 0.481 g. In addition, 0.504 g of Polymer A was mixed in 20.0 g of 80% diacetone alcohol (in water) and 0.473 g of Polymer A was recovered. A solubility of about 1.5 mg/g was obtained in either solvent.

SYNTHESIS EXAMPLE S2

Polymer B-Inventive

AIBN (1.6 g), PMI (24.0 g), acrylonitrile (36.0 g), methacrylic acid (12.0 g), N-methoxy methyl methacrylamide (8.0 g), and DMAC (320 g) were placed in a 1000-ml 3-necked flask, equipped with magnetic stirring, temperature controller, condenser, and $N_2$ inlet. The reaction mixture was heated to 60° C. and stirred under $N_2$ protection for 16 hours after which AIBN (0.1 g) was added and the reaction was continued for another 6 hours. The reaction mixture was slowly dropped into 12 liter of ice water while stirring and a precipitate was formed. After filtration and drying at below 50° C., 69 g of the desired solid polymer were obtained.

SYNTHESIS EXAMPLE S3

Polymer C-Comparative, without Recurring Unit A

AIBN (0.3 g), PMI (7.0 g), acrylonitrile (10.0 g), methacrylic acid (3.0 g), and DMAC (80 g) were placed in a 500-ml 3-necked flask, equipped with magnetic stirring, temperature controller, condenser, and $N_2$ inlet. The reaction mixture was heated to 60° C. and stirred under $N_2$ protection for 16 hours. The reaction mixture was slowly dropped into 2000 ml of ice water while stirring and a precipitate was formed. After filtration and drying at below 50° C., 16 g of the desired solid polymer were obtained.

SYNTHESIS EXAMPLE S4

Polymer D-Comparative, Without Recurring Unit B

AIBN (0.4 g), PMI (10.0 g), methacrylic acid (3.0 g), N-methoxy methyl methacrylamide (2.0 g), methacrylamide (5.0 g), and DMAC (80 g) were placed in a 500-ml 3-necked flask, equipped with magnetic stirring, temperature controller, condenser and $N_2$ inlet. The reaction mixture was heated to 80° C. and stirred under $N_2$ protection for 16 hours. The reaction mixture was slowly dropped into 3000 ml of ice water while stirring and a precipitate was formed. After filtration and drying at below 50° C., 18.2 g of the desired solid polymer were obtained.

SYNTHESIS EXAMPLE S5

Polymer E-Comparative, without Recurring Unit C

AIBN (0.8 g), PMI (8.0 g), acrylonitrile (18.0 g), N-methoxy methyl methacrylamide (6.0 g), methacrylamide (8.0 g), and DMAC (160 g) were placed in a 500-ml 3-necked flask, equipped with magnetic stirring, temperature controller, condenser and $N_2$ inlet. The reaction mixture was heated to 70° C. and stirred under $N_2$ protection for 16 hours. The reaction mixture was slowly dropped into 3000 ml of ice water while stirring and a precipitate was formed. After filtration and drying at below 50° C., 35 g of the desired solid polymer were obtained.

SYNTHESIS EXAMPLE S6

[N-4-Carboxyphenyl)Methacrylamide (N-BAMAAm)]

Acetonitrile (300 ml), methacrylic acid (47.6 g), and ethyl chloro formate (60.05 g) were added in 2-liter 4-neck ground glass flask, equipped with a heating mantle, temperature controller, mechanical glass stirrer, condenser, pressure equalized addition funnel, and nitrogen inlet. Triethylamine (55.8 g) was then added slowly at room temperature over one hour while maintaining the reaction temperature maximum at 40° C. The reaction mixture was then stirred for an additional one hour at room temperature. Triethylamine hydrochloride salt (TEA:HCl) was removed and theoretical amount of TEA:HCl salt was obtained. The mother liquor was placed back into the flask and 4-amino benzoic acid (68.55 g) was added. The reaction mixture was then heated to 50° C. and kept there for 3 hours. The mixture was precipitated in 2.5 liters of 0.1N HCl solution and washed with 1.25 liters of water. The powder was collected by filtration and dried in vacuum oven below 40° C. overnight.

SYNTHESIS EXAMPLE S7

Polymer F-Comparative

Dimethylacetamide (65 g), N-BAMAAm (6.5 g), acrylonitrile (8.4 g), methacrylamide (1.7 g), N-phenyl maleimide (0.9 g), and AIBN (0.175 g) were added to a 500 ml 4-neck ground glass flask, equipped with a heating mantle, temperature controller, mechanical stirrer, condenser, pressure equalized addition funnel, and nitrogen inlet. The reaction mixture was heated to 80° C. under a nitrogen atmosphere. Then a pre-mixture of dimethylacetamide (100 g), N-BAMAAm (19.4 g), acrylonitrile (25.2 g), methacrylamide (5.3 g), N-phenyl maleimide (2.6 g), and Vazo-64 (0.35 g) were added over two hours at 80° C. The reaction mixture was continued another eight hours and AIBN (0.35 g) was added two more times. The polymer conversion was >99% based on a determination of percent of non-volatiles. The resin solution was precipitated in powder form using ethanol/water (60:40) using Lab Dispersator (4000 RPM) and filtered, and the slurry was re-dissolved in ethanol and filtered. The resulting powder was dried at room temperature for 48 hours. The resulting yield was 85%.

SYNTHESIS EXAMPLE S8

Polymer G-Comparative

Methyl cellosolve (199.8 g), N-methoxymethyl methacrylamide (18 g), benzyl methacrylate (11.4 g), methacrylic acid (3 g), dodecyl mercaptan (0.075 g), and AIBN (0.6 g) were added to 500 ml 4-neck ground glass flask, equipped with a heating mantle, temperature controller, mechanical stirrer, condenser, pressure equalized addition funnel and nitrogen inlet. The reaction mixture was heated to 80° C. under nitrogen atmosphere. Then, a pre-mixture of N-methoxymethyl methacrylamide (55 g), benzyl methacrylate (34 g), methacrylic acid (9 g), dodecyl mercaptan (0.225 g), and AIBN (1.2 g) were added over two hours at 80° C. The reaction mixture was continued another eight hours and AIBN (0.35 g) was added two more times. The resin solution was precipitated in powder form using DI water/Ice (3:1) and a Lab Dispersator (4000 RPM) and then filtered. The resulting powder was dried at room temperature for 24 hours. The next day, a tray containing the desired polymer was placed in oven at 110° F. (43° C.) for two additional days. The yield was 95%.

The following Synthesis Examples S9-S11 demonstrate that N-hydroxymethyl(meth)acrylate was not a suitable monomer to provide "A" recurring units to prepare a polymeric binder for the inner layer of imageable elements. Gelation occurred during polymer synthesis, suggesting that N-hydroxymethyl(meth)acrylate was unstable and tended to crosslinking.

SYNTHESIS EXAMPLE S9

Polymer H-Comparative

Dimethylacetamide (51.5 g), N-phenylmaleimide (5.0 g), acrylonitrile (11.0 g), methacrylic acid (2.5 g), N-hydroxymethyl methacrylamide (6.6 g, available from ABCR Germany as a MP9078, 60% in water), methacrylamide (2.5 g), and AIBN (0.25 g) were charged in 500 ml 4-neck ground glass flask, equipped with a heating mantle, temperature controller, mechanical stirrer, condenser, pressure equalized addition funnel, and nitrogen inlet. The reaction mixture was heated to 80° C. under nitrogen atmosphere. Then, a pre-mixture of dimethylacetamide (89.7 g), N-phenylmaleimide (15.0 g), acrylonitrile (34.0 g), methacrylic acid (7.5 g), N-hydroxymethyl methacrylamide (18.3 g), methacrylamide (7.5 g), and AIBN (0.5 g) were added into the flask at 80° C. Gellation occurred before the addition was finished.

SYNTHESIS EXAMPLE S10

Polymer I-Comparative

Dimethylacetamide (51.5 g), N-Phenylmaleimide (7.5 g), acrylonitrile 11.0 g), methacrylic acid (4.0 g), N-hydroxymethyl methacrylamide (4.0 g), and AIBN (0.25 g) were charged in 500 ml 4-neck ground glass flask, equipped with a heating mantle, temperature controller, mechanical stirrer, condenser, pressure equalized addition funnel, and nitrogen inlet. The reaction mixture was heated to 80° C. under nitrogen atmosphere. Then a pre-mixture of dimethylacetamide (93.3 g), N-phenylmaleimide (22.5 g), acrylonitrile (34.0 g), methacrylic acid (11.0 g), N-hydroxymethyl methacrylamide (12.7 g), and AIBN (0.5 g) were added into the flask over a two-hour period at 80° C. Gellation occurred one hour after the addition was finished.

SYNTHESIS EXAMPLE S11

Polymer J-Comparative

Dimethylacetamide (44.8 g), N-phenylmaleimide (12.5 g), methacrylic acid (4 g), N-hydroxymethyl methacrylamide (4.0 g), methacrylamide (6.0 g), and AIBN (0.25 g) were charged in 500 ml 4-neck ground glass flask, equipped with a heating mantle, temperature controller, mechanical stirrer, condenser, pressure equalized addition funnel, and nitrogen inlet. The reaction mixture was heated to 80° C. under nitrogen atmosphere. Then, a pre-mixture of dimethylacetamide (100 g), N-phenylmaleimide (37.5 g), methacrylic acid (11.0 g), N-hydroxymethyl methacrylamide (12.7 g), methacrylamide (19.0 g), and AIBN (0.5 g) were added into the flask at 80° C. Gellation occurred before the addition was finished.

INVENTION EXAMPLE 1

Positive-Working Multi-layer Imageable Elements with Polymer A in the Inner Layer Multi-layer imageable elements according to the present invention were prepared as follows:

Inner layer: A coating composition was prepared by dissolving inventive Polymer A (5.25 g) in a solvent mixture of BLO (9.27 g), PGME (13.9 g), MEK (60.26 g), and water (9.27 g). IR Dye A (0.94 g) and D11 (0.04 g) were then added to this solution followed by 10% Byk® 307 in PGME (0.19 g). The resulting solution was coated onto an aluminum substrate to achieve a 1.5 $g/m^2$ dry coating weight.

Outer layer: A coating formulation of RX-04 (4.971 g), ethyl violet (0.014 g), 10% Byk1307 (0.149 g), DEK (85.38 g), and acetone (9.48 g) was coated over the inner layer to give a dry coating weight of 0.5 $g/m^2$.

The imageable elements were thermally imaged on a conventional Creo Trendsetter® 3244 (Kodak) platesetter having a laser diode array emitting at 830 nm with a variety of exposure energies from 80 to 167 $mJ/cm^2$. The exposed elements were developed using 956 Developer (from Kodak) in a NE-34 processor, removing the exposed areas to reveal the hydrophilic substrate. The resulting lithographic printing plates exhibited good images (clean-out point) at about 90 mJ/cm$^2$ exposure after development.

INVENTION EXAMPLE 2

Positive-Working Multi-layer Imageable Elements with Polymer B in the Inner Layer Multi-layer imageable elements of this invention were prepared as follows:

Inner layer: A coating composition was prepared by dissolving inventive Polymer A (5.25 g) in a solvent mixture of BLO (9.27 g), PGME (13.9 g), MEK (60.26 g), and water (9.27 g). IR Dye A (0.94 g) and D11 (0.04 g) were then added to this solution followed by 10% Byk1307 in PGME (0.19 g). The resulting solution was coated onto an aluminum substrate to achieve a 1.5 g/m$^2$ dry coating weight.

Outer layer: A coating formulation of P3000 (4.01 g), ethyl violet (0.014 g), 10% Byk1307 (0.149 g), DEK (85.3 g), and acetone (9.5 g) was coated over the inner layer to give a dry coating weight of 0.5 g/m$^2$.

The imageable elements were thermally imaged on a conventional Creo Trendsetter® 3244 (Kodak) having a laser diode array emitting at 830 nm with a variety of exposure energies from 80 to 167 mJ/cm$^2$. The exposed elements were developed using 956 Developer (from Kodak) in a NE-34 processor, removing the exposed areas to reveal the hydrophilic substrate. The resulting lithographic printing plates exhibited good images (clean-out point) at about 103 mJ/cm$^2$ exposure after development.

COMPARATIVE EXAMPLE 1

Positive-Working Multi-layer Imageable Element with Polymer C in the Inner Layer Multi-layer imageable elements were prepared as described in Invention Example 1, except for using Polymer C in replacing of Polymer A.

COMPARATIVE EXAMPLE 2

Positive-Working Multi-layer Imageable Element with Polymer D in the Inner Layer Multi-layer imageable elements were prepared as described in Invention Example 1, except for using Polymer D in replacing of Polymer A.

COMPARATIVE EXAMPLE 3

Positive-Working Multi-layer Imageable Element with Polymer E in the Inner Layer Multi-layer imageable elements were prepared as described in Invention Example 1, except for using Polymer E in replacing of Polymer A.

COMPARATIVE EXAMPLE 4

Positive-Working Multi-layer Imageable Element Using Polymers F and G in the Inner Layer (Example 1 from U.S. Ser. No. 11/551,259)

An inner layer coating formulation was prepared by dissolving 3.834 g of Polymer F and 2.13 g of Polymer G in a solvent mixture of 9.27 g of BLO, 13.9 g of PGME, 60.27 g of MEK, and 9.27 g of water. IR Dye A (1.06 g) was then added to this solution followed by addition of 0.211 g of Byk® 307 (10% solution in PGME). The resulting solution was coated onto a grained and anodized aluminum lithographic substrate to provide a 1.5 g/m$^2$ dry inner layer weight.

An outer layer formulation was prepared by mixing 1.503 g of P3000, 3.469g of PD-140,0.014g of ethyl violet, 0.149g of 10% Byk® 307 in 85.38 g of DEK, and 9.48 g of acetone. This formulation was coated over the inner layer formulation described above to provide a dry outer layer weight of 0.5 g/m$^2$.

The dried imageable element was thermally imaged on a commercially available Creo Trendsetter® 3244 having a laser diode array emitting at 830 nm with a variety of exposure energies from 60 to 140 mj/cm$^2$. The resulting imaged element was developed with 956 Developer in a commercial processor. The minimum energy to achieve a desired image was about 100 mJ/cm$^2$.

All imageable elements described above were tested by following methods (a)-(d) to evaluate their properties that can be essential to provide a high quality printing plate precursor. The results are summarized in TABLE I below.

(a) Developer Clean Time test: This is the time for completely or fully removing the inner layer with no outer layer present, when Developer 956 is applied. A clean time of 5-20 seconds was considered appropriate for obtaining a good image.

(b) BC drop test: A butyl cellosolve (80% in water) solution was dropped onto the inner layer surface at regular intervals up to 15 minutes. The ratings used were: Excellent (no obvious coating damage up to 15 minutes), Good (no obvious coating damage up to 10 minutes), and Poor (obvious coating damage in 5 minutes).

(c) DAA drop test: A diacetone alcohol (or 4-hydroxy-4-methyl-2-pentanone, 80% in water) solution was dropped onto the inner layer surface at regular intervals up to 15 minutes. The ratings used were: Excellent (no obvious coating damage up to 15 minutes), Good (no obvious coating damage up to 10 minutes), and Poor (obvious coating damage in 5 minutes).

(d) Thermal Bakeability test: A PS plate image remover, PE-35 (from DIC, Japan), was applied to the inner layer surface that had been baked at 190° C. for 2 minutes, at regular intervals up to 5 minutes. The ratings used were: Excellent (no obvious coating damage up to 5 minutes), Good (no obvious coating damage up to 1 minute), and Poor (obvious coating damage in 1 minute).

TABLE I

| Polymer ID | Developer Clean Time (seconds) | BC drop test | DAA drop test | Thermal Bakeability |
|---|---|---|---|---|
| Invention Example 1 | 8 | Excellent | Good | Excellent |
| Invention Example 2 | 12 | Excellent | Good | Excellent |
| Comparative Example 1 | 15 | Excellent | Good | Poor |
| Comparative Example 2 | 15 | Poor | Poor | Poor |
| Comparative Example 3 | >120 | Excellent | Good | Poor |
| Comparative Example 4 | 10 | Excellent | Poor | Excellent |

These results (TABLE I) show that the polymers prepared according to the present invention, containing all A, B, C, and D recurring units derived from the Structure I provided the best performance in developability, solvent resistance, and thermal bakeability tests.

The invention has been described in detail with particular reference to certain preferred embodiments thereof, but it will be understood that variations and modifications can be effected within the spirit and scope of the invention.

The invention claimed is:

1. A positive-working imageable element comprising a radiation absorbing compound and a substrate having a hydrophilic surface, and having on said substrate, in order:

an inner layer composition comprising from about 60 to about 95 weight % of a polymeric binder, based on the dry total inner layer composition weight, and an ink receptive outer layer, provided that upon thermal imaging, the exposed regions of said element are removable by an alkaline developer, wherein said polymeric binder has an acid number of at least 40 and consists essentially of the recurring units consisting of the recurring units represented by the following Structure (I):

$$-(A)_w-(B)_x-(C)_y-(D)_z- \quad (I)$$

wherein

A represents recurring units derived from one or more N-alkoxymethyl (alkyl)acrylamides or alkoxymethyl (alkyl)acrylates, B represents recurring units derived from one or more ethylenically unsaturated polymerizable monomers having a pendant cyano group, C represents recurring units derived from one or more ethylenically unsaturated polymerizable monomers having one or more carboxy, sulfonic acid, or phosphate groups, D represents recurring units derived from one or more ethylenically unsaturated polymerizable monomers that are represented by Structures (D1) through (D5) shown below, w is from about 3 to about 80 weight %, x is from about 10 to about 85 weight %, y is from about 2 to about 80 weight %, and z is from about 10 to about 85 weight %, (D1)

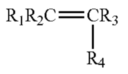

(D2)

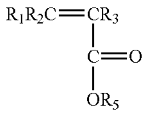

(D3)

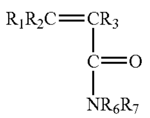

(D4)

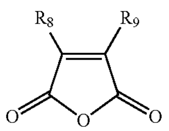

-continued (D5)

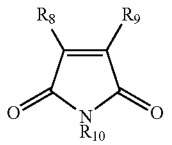

wherein $R_1$ and $R_2$ are independently hydrogen or alkyl, alkenyl, phenyl, halo, alkoxy, acyl, or acyloxy groups, or $R_1$ and $R_2$ together can form a cyclic ring with the carbon atom to which they are attached, $R_3$ and $R_4$ are independently hydrogen or alkyl, phenyl, or halo groups, $R_5$ is an alkyl, alkenyl, cycloalkyl, or phenyl group, $R_6$ through $R_9$ are independently hydrogen or alkyl, alkenyl, phenyl, halo, alkoxy, acyl, or acyloxy groups, and $R_{10}$ is hydrogen or an alkyl, phenyl, or hydroxy group.

2. The element of claim 1 wherein said polymeric binder has an acid number of at least 50.

3. The element of claim 1 wherein said A recurring units are derived from one or more ethylenically unsaturated monomers represented by the following Structure (II):

(II)

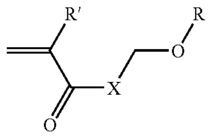

wherein R is an alkyl group having 1 to 8 carbon atoms, an alkenyl group having 1 to 6 carbon atoms, a cycloalkyl group, or a phenyl group, R' is hydrogen or an alkyl having 1 to 4 carbon atoms, and X is —O— or —NH—.

4. The element of claim 1 wherein said B recurring units are derived from one or more (meth)acrylonitriles, cyanostyrenes, and cyanoacrylates.

5. The element of claim 1 wherein said C recurring units are derived from one or more (meth)acrylic acids, carboxystyrenes, N-carboxyphenyl (meth)acrylamides, and (meth)acryloylalkyl phosphates.

6. The element of claim 1 wherein said polymeric binder consists of:

A recurring units derived from:

one or more of N-methoxymethyl methacrylamide, N-isopropoxymethyl methacrylamide, N-n-butoxymethyl methacrylamide, N-ethoxymethyl acrylamide, N-methoxymethyl acrylamide, iso-propoxymethyl methacrylate, N-cyclohexoxymethyl methacrylamide, and phenoxymethyl methacrylate, B recurring units derived from one or more of acrylonitrile, methacrylonitrile, p-cyanostyrene, and ethyl-2-cyanoacrylate, C recurring units derived from one or more of acrylic acid, methacrylic acid, p-carboxystyrene, p-carboxyphenyl methacrylamide, and (meth)acryloylethyl phosphate, and D recurring units derived from one or more of styrene, N-phenylmaleimide, methacrylamide, and methyl methacrylate.

7. The element of claim 1 wherein w is from about 10 to about 55 weight %, x is from about 20 to about 70 weight %, y is from about 5 to about 50 weight %, and z is from about 20 to about 70 weight %.

8. The imageable element of claim 1 wherein said radiation absorbing compound is an infrared absorbing compound that is present in said inner layer composition in an amount of from about 2 to about 50 weight % based on the total dry weight of said inner layer.

9. The imageable element of claim 1 wherein said radiation absorbing compound is present only in said inner layer composition.

10. The imageable element of claim 1 wherein upon thermal imaging, the exposed regions of said element are removable by an organic solvent-containing developer having a pH less than 12.

11. The imageable element of claim 1 wherein said polymeric binder has a solubility of less than 30 mg/g when agitated for 24 hours at 25° C. in either an 80% aqueous solution of 2-butoxyethanol or an 80% aqueous solution of diacetone alcohol.

12. The imageable element of claim 1 that is a lithographic printing plate precursor having a hydrophilic aluminum-containing substrate.

13. A method for forming an image comprising:

A) imagewise exposing the positive-working imageable element of claim 1 imaging radiation, thereby forming an imaged element with exposed and non-exposed regions, B) contacting said imaged element with an alkaline developer to remove only said exposed regions, and C) optionally, baking said imaged and developed element.

14. The method of claim 13 wherein said imagewise exposing is carried out using an infrared laser providing radiation at a wavelength of from about 600 to about 1200 nm, and said imaged element is contacted with an alkaline developer having a pH less than 12.

15. The method of claim 13 wherein said imaged and developed element is baked at from about 160 to about 220° C. for from about 2 to about 5 minutes, or by overall infrared radiation exposure at from about 800 to about 850 nm.

16. The method of claim 13 wherein said polymeric binder consists of:

from about 10 to about 55 weight %, recurring units that are derived from one or more ethylenically unsaturated monomers represented by the following Structure (II):

(II)

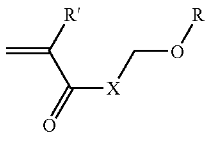

wherein R is an alkyl group having 1 to 8 carbon atoms, an alkenyl group having 1 to 6 carbon atoms, or a phenyl group, R' is hydrogen or an alkyl having 1 to 4 carbon atoms, and X is —O—or —NH—, in an amount of from about 20 to about 70 weight %, recurring units are derived from one or more (meth) acrylonitriles, cyanostyrenes, and cyanoacrylates, in an amount of from about 5 to about 50 weight %, recurring units are derived from one or more (meth)acrylic acids, carboxystyrenes, carboxyphenyl (meth)acrylamides, and (meth)acryloylalkyl phosphates, and in an amount of from about 20 to about 70 weight %, recurring units are derived from one or more ethylenically unsaturated polymerizable monomers represented by the following Structures (D1) through (D5):

(D1)

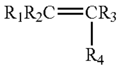

(D2)

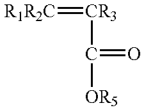

(D3)

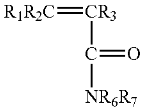

(D4)

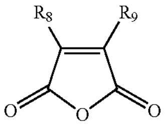

(D5)

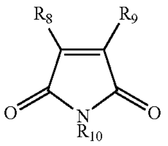

wherein $R_1$ and $R_2$ are independently hydrogen or alkyl, alkenyl, phenyl, halo, alkoxy, acyl, or acyloxy groups, or $R_1$ and $R_2$ together can form a cyclic ring with the carbon atom to which they are attached, $R_3$ and $R_4$ are independently hydrogen or alkyl, phenyl, or halo groups, $R_5$ is an alkyl, alkenyl, cycloalkyl, or phenyl group, $R_6$ through $R_9$ are independently hydrogen or alkyl, alkenyl, phenyl, halo, alkoxy, acyl, or acyloxy groups, and $R_{10}$ is hydrogen or an alkyl, phenyl, or hydroxy group, wherein said polymeric binder is present in an amount of from about 60 to about 95 weight %, based on total dry inner layer composition weight, said radiation absorbing compound is an infrared absorbing compound that is present in said inner layer composition only in an amount of from about 5 to about 25 weight % based on the total dry weight of said inner layer, and said polymeric binder comprises from about 60 to 100 weight % of all polymeric binders in said inner layer composition.

* * * * *